United States Patent [19]

Pfiester

[11] Patent Number: 4,992,388
[45] Date of Patent: Feb. 12, 1991

[54] SHORT CHANNEL IGFET PROCESS

[75] Inventor: James R. Pfiester, Austin, Tex.

[73] Assignee: Motorola, Inc., Schaumburg, Ill.

[21] Appl. No.: 444,651

[22] Filed: Dec. 1, 1989

[51] Int. Cl.$^5$ .......................................... H01L 21/336
[52] U.S. Cl. .......................................... 437/41; 437/40;
437/162; 437/193; 437/980; 148/DIG. 19;
148/DIG. 26; 357/23.3
[58] Field of Search ............... 437/40, 41, 44, 191,
437/193, 200, 203, 67, 162, 980, 233; 148/DIG.
53, DIG. 26, DIG. 19; 357/23.1, 23.3

[56] References Cited

U.S. PATENT DOCUMENTS

| | | | |
|---|---|---|---|
| 4,473,598 | 9/1984 | Ephrath et al. | 427/86 |
| 4,753,709 | 6/1988 | Welch et al. | 437/200 |
| 4,764,481 | 8/1988 | Alvi et al. | 437/40 |
| 4,803,173 | 2/1989 | Sill et al. | 437/29 |
| 4,845,046 | 7/1989 | Shimbo | 437/41 |
| 4,847,214 | 7/1989 | Robb et al. | 437/67 |

FOREIGN PATENT DOCUMENTS 0000765  1/1989  Japan ........................... 357/23.3

OTHER PUBLICATIONS

Terman, L. M., IBM Technical Disclosure Bulletin, vol. 13, No. 11, Apr. 1971, pp. 3279-3280.
Furumura, Y. et al., "Selective Growth of Polysilicon", J. Electrochem. Soc., vol. 133, No. 2, Feb. 1986, pp. 379-383.

Primary Examiner—Brian E. Hearn
Assistant Examiner—T. N. Quach
Attorney, Agent, or Firm—John A. Fisher

[57] ABSTRACT

A process is disclosed for the fabrication of semiconductor devices which yields a device having a very short effective channel length and having polycrystalline source and drain electrodes. In accordance with the disclosed process, a semiconductor substrate is provided having a masking element positioned on the substrate surface. A layer of polycrystalline silicon is deposited on the exposed areas of the substrate surface by the process of selective deposition. The selectively deposited polycrystalline silicon is doped with conductivity determining impurities and that impurity material is thereafter redistributed to dope the underlying substrate to form source and drain regions. The masking element is removed to expose the portion of the semiconductor surface between the source and drain regions and to allow for a subsequent optional channel implantation. A gate insulator is formed overlying that portion between the source and drain regions and a second layer of silicon is deposited to overlay the gate insulator. The second layer of silicon is patterned to form the gate electrode of the insulated gate field effect transistor.

15 Claims, 3 Drawing Sheets

SHORT CHANNEL IGFET PROCESS

BACKGROUND OF THE INVENTION

This invention relates generally to semiconductor devices, and more particularly to a process for manufacturing short channel insulated gate field effect transistors.

As the complexity of semiconductor integrated circuits is increased, it becomes necessary to decrease the size of each of the individual components making up that integrated circuit. It is not sufficient, however, to arbitrarily reduce device dimensions; it is also a continuing requirement that these integrated circuits containing an increasing number of smaller and smaller devices must be readily manufacturable and reliable.

One proposal to reduce component size has been to provide polycrystalline silicon contacts to the source and drain regions of an insulated gate field effect transistor (IGFET). Such Devices having polcrystalline silicon contacts, although smaller than devices with more conventional contacts, have not been readily reducible to channel lengths in the submicron range using conventional optical lithography. In addition, fabricating such devices using conventional process technology has not not resulted in a highly reliable device.

A need therefore existed for a process which would provide for the fabrication of devices with polycrystalline silicon contacts and very short channel lengths in a highly manufacturable and reliable form.

It is therefore an object of this invention to provide an improved process for fabricating short channel IGFETs.

It is a further object of this invention to provide an improved process for the fabrication of semiconductor devices having polycrystalline silicon contacts to source and drain regions.

BRIEF SUMMARY OF THE INVENTION

The foregoing and other objects of the invention are achieved through a process which uses selective deposition to obtain self-alignment and small device feature sizes. In accordance with one embodiment of the invention, a semiconductor substrate is provided with a masking element positioned on the substrate surface. The masking element masks a first portion of the surface and exposes a second portion. By the process of selective deposition a layer of polycrystalline silicon is deposited on the exposed areas of the substrate surface. The polycrystalline silicon and the underlying substrate are doped with conductivity determining dopant material to form the source and drain regions and the source and drain contacts of the semiconductor device. The masking element is removed from the surface of the semiconductor substrate to expose a portion of the surface positioned between the source and drain regions. An insulator is formed overlaying the exposed portion of the substrate surface and the surfaces of the polycrystalline silicon material. A second layer of silicon is deposited overlaying the insulator and is subsequently patterned to form the gate electrode of the semiconductor device.

DETAILED DESCRIPTION OF THE PREFERRED EMBODIMENTs

Figure 1:
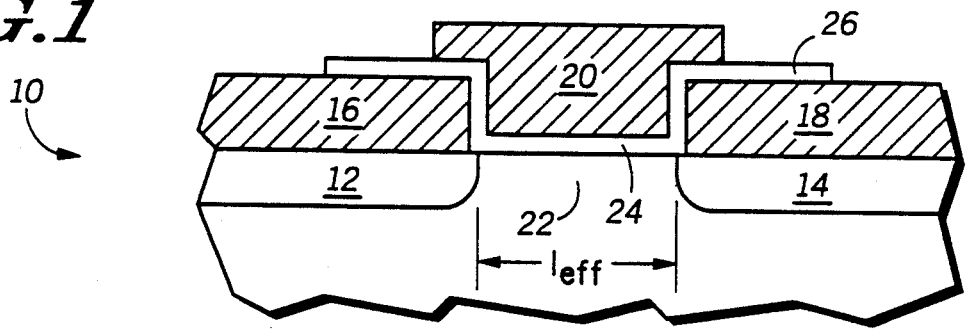
Fig. 1 illustrates, in cross-section, a portion of a semiconductor device fabricated in accordance with the invention.

FIG. 1 illustrates, in cross-section, a portion of a semiconductor device 10 fabricated in accordance with the invention. Device 10 includes a source region 12 and drain region 14 which are contacted by polycrystalline silicon electrodes 16 and 18, respectively. A gate electrode 20 overlays and is separated from the channel region 22 by a thin gate insulator 24. An insulator 26 electrically isolates the gate electrode from either the source electrodes 16 or the drain electrode 18. Device 10, fabricated in accordance with the invention, can be fabricated using optical lithography to have an effective channel length, $l_{eff}$, of less than 0.5 micrometers. The process in accordance with the invention is capable of achieving effective channel lengths as short as about 0.1 micrometers using optical lithography.

FIGS. 2-9 illustrate, in cross-section, process steps in accordance with preferred embodiments of the invention. The enumerated process steps illustrate the fabrication of a portion of a single IGFET device. In the fabrication of an integrated circuit, many similar devices would be fabricated simultaneously and then interconnected to form the desired circuit function. The process is applicable to the fabrication of N-channel devices, P-channel devices, or the simultaneous fabrication of N and P channel devices to form a CMOS integrated circuit. Only the fabrication of a device of a single conductivity type is illustrated, but those of skill in the art can readily extend the inventive principle to the fabrication of devices of opposite conductivity type or to the fabrication of CMOS devices.

Figure 2:
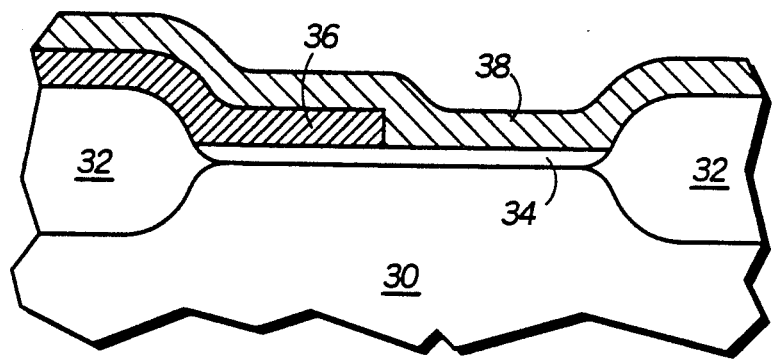
FIGS. 2-9 illustrate, in cross-section, process steps in accordance with one embodiment of the invention by which an insulated gate field effect transistor is fabricated.

FIG. 2 illustrates the initial steps in the fabrication of a device in accordance with the invention. The device is fabricated in a semiconductor substrate 30 such as a silicon substrate of P type conductivity. Field oxide 32 or other commonly used isolation technique is used to electrically isolate the device being fabricated from an adjacent device in the circuit. In accordance with this preferred embodiment, a thin insulating layer 34 is formed on the surface of semiconductor substrate 30 such as by thermal oxidation. A layer of polycrystalline silicon is deposited over the insulator 34 and patterned to form an initial masking element 36. A layer of 38 of sidewall spacer forming material such as silicon nitride is deposited over the masking element 36. Other materials besides polycrystalline silicon and silicon nitride can be used in these initial steps as long as the proper etch selectivity is maintained, as explained later in the process.

Figure 3:
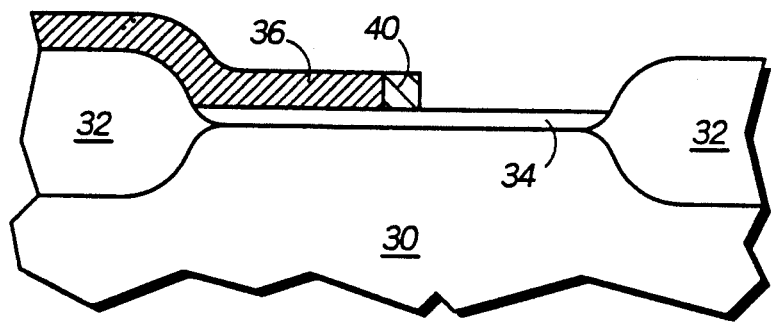

As illustrated in FIG. 3, the layer of sidewall spacer forming material is anisotropically etched, such as by reactive ion etching, to leave a sidewall spacer 40 at the sidewall of masking element 36. The sidewall spacer forming material must therefore be of a material which can be etched selectively with respect to the material forming masking element 36. Additionally, some etch selectivity is required between the sidewall spacer forming material and the insulator 34 overlaying the surface of substrate 30. Thus the anisotropic etching of sidewall spacer forming material 38 stops on insulating material 34 and masking element 36.

Figure 4:
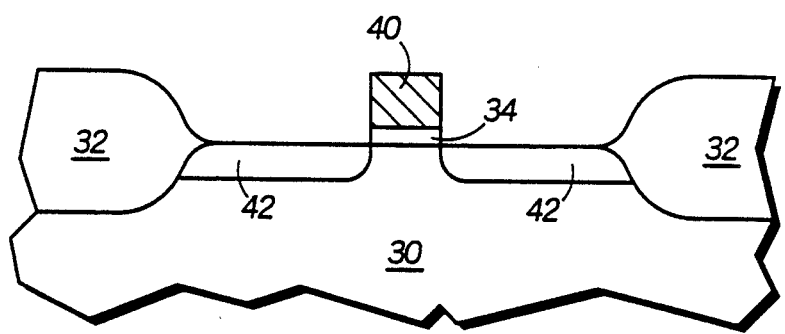

Masking element 36 is next removed by etching in either a wet or dry etchant leaving sidewall spacer 40 on insulator layer 34. The process thus forms a sidewall spacer having a narrow width which will subsequently act as a narrow masking element. The width of sidewall spacer 40 is determined, for the most part, by the thickness of masking element 36. In this manner a sidewall spacer having a width of 0.1-0.3 micrometers is easily achievable. The narrow masking element is easily achievable, in accordance with one embodiment of the invention, without resorting to other than conventional optical lithography. As an option, sidewall spacer 40 can now be used as an ion implantation mask to mask the implantation of arsenic or phosphorus ions which form a lightly doped source and drain region 42. Sidewall spacer 40 is then used as an etch mask for the removal of those portions of insulator 34 which are not overlaid by the spacer. Portions of the surface of substrate 30 in which the source and drain regions will be formed are thus exposed and the eventual channel region positioned between the source and drain regions is masked by sidewall spacer 40 as illustrated in FIG. 4. In FIGS. 4-9 as well as in FIG. 1, the width of the spacer 40 and the resulting structure has been expanded for clarity.

Figure 5:
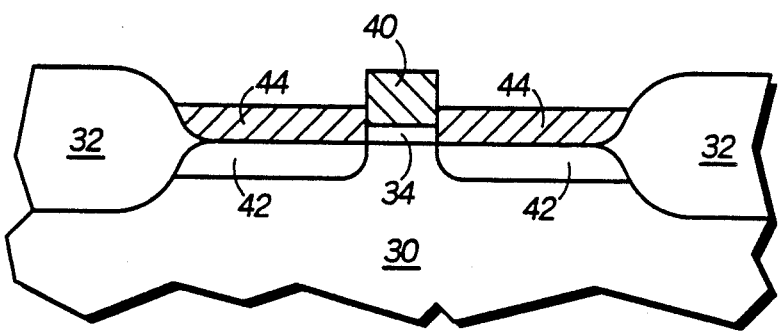
Figure 6:
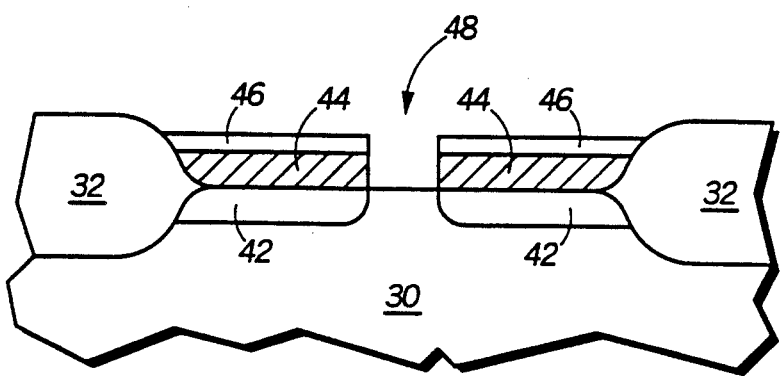
Figure 7:
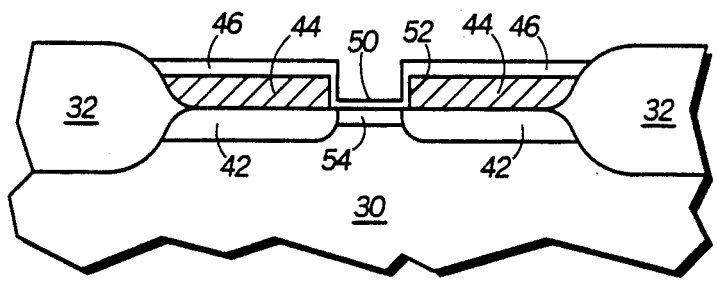
Figure 8:
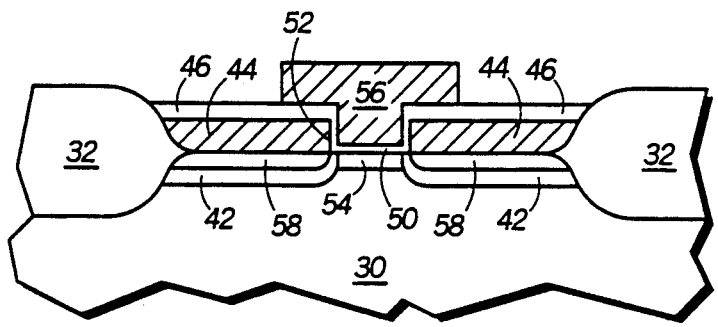

In accordance with the invention, contacts to the source and drain regions are formed by the selective deposition of polycrystalline silicon as illustrated in FIG. 5. Selective deposition is a chemical vapor deposition process in which the deposition conditions are adjusted, in known manner, so that the material being deposited deposits only on a prepared nucleating surface. Polycrystalline silicon, for example, can be deposited selectively on exposed silicon surfaces with the exposed silicon surface nucleating the deposition of the polycrystalline silicon. By providing a patterned nucleating layer or a patterned exposed portion of a nucleating layer the selectively deposited material can be deposited in a desired location. The selectively deposited material is not deposited in those locations in which there is no exposed nucleating layer. Sidewall spacer 40 is formed of a material such as silicon nitride which is chosen from those materials which are not a nucleating site for the selective deposition of polycrystalline silicon. The polycrystalline silicon thus deposits on the exposed silicon surface and not on the silicon nitride. The selectively deposited polycrystalline silicon contacts to the source and drain regions can be doped with conductivity determining dopants during the selective deposition or subsequent to the deposition by ion implantation or the like. The doping of the polycrystalline silicon contacts reduces the resistivity and the contact resistance of the material and provides a source of dopant for the subsequent doping of the underlying source and drain regions.

Preferably the process continues by oxidizing the top surface of selectively deposited polycrystalline silicon 44 to form a thermal oxide layer 46 which will later serve to reduce the capacitance between the source and drain electrodes and the subsequently formed gate electrode. Sidewall spacer 40 and the underlying insulator 34 are then removed to provide the structure illustrated in FIG. 6. Sidewall spacer 40, in accordance with the invention, is formed to have a width of only a few tenths of a micrometer. Source and drain electrodes 44, formed by the process of selective deposition, thus are separated by that same small dimension. The space noted by the numeral 48 between the source and drain electrodes will form the channel of the IGFET being formed. This space can be more narrow than the space which would be reproducibly and reliably formed by the conventional process of optical lithography. The closely spaced source and drain electrodes are formed in self alignment with the narrow channel region.

The structure is next thermally oxidized to form a gate oxide 50. The exposed ends of polycrystalline silicon electrodes 44 are also oxidized to form an oxide layer 52. The oxide 46 overlaying electrodes 44 is also increased in thickness by this thermal oxidation step. An an optional step, the channel region can be implanted with conductivity determining ions to determine the threshold voltage of the IGFET being formed. The implanted channel region is indicated by the numeral 54 in FIG. 7 and is self aligned with the source and drain electrodes.

Following the formation of gate insulator 50, a layer of polycrystalline silicon is uniformly deposited over the structure and patterned to form gate electrode 56. Gate electrode 56 is electrically isolated from the channel by gate insulator 50 and from source and drain electrodes 44 by insulators 52 and 46. A number of options are available for the fabrication of gate electrode 56. For example, the electrode can be formed by the deposition of a doped layer of polycrystalline silicon or by the deposition of an undoped layer of polycrystalline silicon which is subsequently doped by ion implantation or by thermal diffusion. In either case, the gate electrode can be either heavily doped or lightly doped, either N-type or P-type, as desired for the device being implemented, to determine the work function between the gate electrode and the underlying channel and thus to determine the threshold voltage of the device. The doping of gate electrode 56 can be carried out substantially independently of the doping of source and drain regions. If the gate electrode is doped before the layer of polycrystalline silicon is etched, the doping can be totally independent of the source and drain doping because the polycrystalline silicon layer shields the source and drain from the dopant. If doped after the layer is patterned, the doping of the gate electrode will be cumulative with the source and drain doping, but can easily be made significantly lower in concentration so as to be of little consequence. The source and drain regions are formed by the diffusion of conductivity determining dopant from the selectively deposited polycrystalline silicon dopant into the silicon substrate, in addition to the optional ion implantation of source and drain regions 42. Such diffusion is accomplished by any high temperature step such as the thermal oxidation of the substrate to form gate insulator 50. The diffusion of dopant material from the polycrystalline silicon source and drain electrodes is indicated by the region 58 in FIG. 8. Alternatively, a separate thermal diffusion step can be used to achieve this dopant redistribution.

In accordance with yet another option (not illustrated), polycrystalline silicon electrode 56 can be deposited in two steps, the first an undoped deposition of polycrystalline silicon followed by a second doped deposition of polycrystalline silicon. Threshold adjusting implants and other process steps can be carried out between the two polycrystalline silicon depositions.

Figure 9:
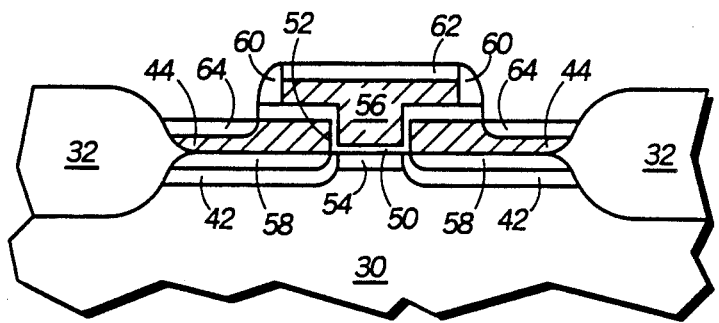

A further embodiment of the process in accordance with the invention is illustrated in FIG. 9. A second sidewall spacer forming material is deposited on the structure and anisotropically etched to form sidewall spacers 60 at the edges of gate electrode 56. The exposed portion of insulator layer 46 is removed using the sidewall spacers as an etch mask and a layer of metal silicide forming metal such as titanium or cobalt is deposited uniformly over the surface of the device. The device structure is heated, in known manner, to react the titanium, cobalt, or other silicide forming metal with the exposed silicon to form a layer of metal silicide 62 at the surface of gate electrode 56 and a layer of metal silicide 64 at the surface of polycrystalline silicon source and drain electrodes 44. The metal silicide reduces the sheet resistivity of the electrodes and improves the speed performance of the device being fabricated.

Thus it is apparent that there has been provided, in accordance with invention, a process for the fabrication of insulated gate field effect devices which fully meets the objects and advantages set forth above. Although the process has been described and illustrated with reference to specific embodiments thereof, it is not intended that the invention be limited to these illustrative embodiments. Those skilled in the art will recognize that variations and modifications are possible without departing from the spirit of the invention. For example, other materials can be used for the sidewall spacer, and other means can be used to achieve the narrow spacer used to mask the selective deposition. Further, other means for forming the various insulators and various materials for those insulators are possible. It is thus intended that the invention include all such variations and modifications as fall within the scope of the appended claims.

What is claimed is:

1. A process for the fabrication of a semiconductor device comprising the steps of: providing a semiconductor substrate having a surface;
   providing a masking element positioned on said surface, said masking element masking a first portion and exposing a second portion thereof;
   depositing by selective deposition a layer of polycrystalline silicon on said exposed areas of said substrate surface;
   doping said layer of polycrystalline silicon and said exposed area of said substrate surface thereunder with conductivity determining dopant material;
   oxidizing said layer of polycrystalline silicon before removing said masking element;
   removing said masking element to expose said first portion of said surface;
   forming an insulator overlaying said first portion of said substrate and said layer of polycrystalline silicon;
   depositing a second layer of silicon overlaying said insulator; and
   patterning said second layer to form a gate electrode.

2. The process of claim 1 further comprising the step of implanting said second layer of silicon with ions of a conductivity determining impurity.

3. The process of claim 2 wherein said step of implanting said second layer of silicon is done before said step of patterning.

4. The process of claim 2 wherein said step of implanting said second layer of silicon is done after said step of patterning.

5. The process of claim 1 wherein said step of doping said layer of polycrystalline silicon and said exposed area of said substrate thereunder comprises the steps of: implanting ions of a conductivity determining impurity into said layer of polycrystalline silicon; and outdiffusing said impurity into said substrate.

6. A process for the fabrication of a semiconductor device comprising the steps of:
   providing a semiconductor substrate having a surface;
   forming a first insulator layer overlaying said surface of said substrate;
   depositing a layer of masking material on said first insulator layer;
   patterning said layer of masking material to form a pattern of masking material having an edge;
   depositing a layer of sidewall spacer forming material overlaying said pattern of masking material;
   anisotropically etching said layer of sidewall spacer forming material to form a sidewall spacer at said edge of said pattern of masking material;
   removing said pattern of masking material to leave said sidewall spacer to provide a masking element positioned on said surface, said masking element masking a first portion and exposing a second portion thereof;
   depositing by selective deposition a layer of polycrystalline silicon on said exposed areas of said substrate surface;
   doping said layer of polycrystalline silicon and said exposed area of said substrate surface thereunder with conductivity determining dopant material;
   removing said masking element to expose said first portion of said surface;
   forming an insulator overlaying said first portion of said substrate and said layer of polycrystalline silicon;
   depositing a second layer of silicon overlaying said insulator; and patterning said second layer to form a gate electrode.

7. A process for the fabrication of a semiconductor device comprising the steps of:
   providing a semiconductor substrate having a surface;
   providing a masking element positioned on said surface, said masking element masking a first portion and exposing a second portion thereof;
   implanting ions of a conductivity determining impurity into said surface of said substrate using said masking element as an ion implantation mask;
   depositing by selective deposition a layer of polycrystalline silicon on said exposed areas of said substrate surface;
   doping said layer of polycrystalline silicon and said exposed area of said substrate surface thereunder with conductivity determining dopant material;
   removing said masking element to expose said first portion of said surface;
   forming an insulator overlaying said first portion of said substrate and said layer of polycrystalline silicon;
   depositing a second layer of silicon overlaying said insulator; and
   patterning said second layer to form a gate electrode.

8. The process of claim 7 further comprising the step of doping said first portion of said substrate with a conductivity determining impurity.

9. The process of claim 7 further comprising the steps of: forming sidewall spacers at the edges of said gate electrode; and
   forming a metal silicide electrically contacting said gate electrode and said layer of polycrystalline silicon.

10. A process for fabricating an insulated gate field effect transistor comprising the steps of:

providing a silicon substrate of first conductivity type having a surface;

depositing and patterning a first masking material overlying said surface to form a shaped structure having a sidewall;

forming a sidewall spacer on said sidewall;

removing said shaped structure to leave said sidewall spacer masking a first portion of said surface and exposing other portions of said surface;

depositing by selective deposition a layer of silicon overlaying said other portions of said surface;

doping said layer of silicon with conductivity determining impurities of second conductivity type;

oxidizing said layer of silicon to form a layer of oxide on the upper surface thereof;

removing said sidewall spacer and exposing said first portion of said surface;

forming a gate insulator on said first portion;

providing a layer of electrically conductive material overlaying said gate insulator; and patterning said layer of electrically conductive material to form a gate electrode.

11. The process of claim 10 further comprising the step of diffusing said conductivity determining impurities of second conductivity type from said layer of silicon into said silicon substrate.

12. The process of claim 11 further comprising the step of implanting said silicon substrate with ions of second conductivity determining type before said step of depositing by selective deposition.

13. The process of claim 10 further comprising the step of implanting conductivity determining ions into said first portion of said surface after said step of removing said sidewall spacer.

14. The process of claim 10 wherein said step of providing a layer of electrically conductive material comprises depositing a layer of polycrystalline silicon.

15. The process of claim 14 wherein said step of depositing a layer of polycrystalline silicon comprises the steps of depositing a first layer of undoped polycrystalline silicon; implanting ions into said substrate to adjust the threshold voltage of the insulated gate field effect transistor; and depositing a second layer of impurity doped polycrystalline silicon.

* * * * *